United States Patent
Huang et al.

(10) Patent No.: US 10,345,938 B2
(45) Date of Patent: Jul. 9, 2019

(54) IN-CELL TOUCH DISPLAY PANELS AND ELECTRONIC DEVICES

(71) Applicant: Wuhan China Star Optoelectronics Technology Co., Ltd., Wuhan (CN)

(72) Inventors: Yaoli Huang, Wuhan (CN); Hongsen Zhang, Wuhan (CN); Xiaoyan Niu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 127 days.

(21) Appl. No.: 15/511,018

(22) PCT Filed: Feb. 16, 2017

(86) PCT No.: PCT/CN2017/073711
§ 371 (c)(1),
(2) Date: Mar. 14, 2017

(87) PCT Pub. No.: WO2018/133141
PCT Pub. Date: Jul. 26, 2018

(65) Prior Publication Data
US 2018/0299998 A1    Oct. 18, 2018

(30) Foreign Application Priority Data
Jan. 23, 2017  (CN) .......................... 2017 1 0050678

(51) Int. Cl.
*G06F 3/041*  (2006.01)
*G06F 3/047*  (2006.01)
*G02F 1/1333*  (2006.01)
*G02F 1/1335*  (2006.01)
*G02F 1/1368*  (2006.01)
(Continued)

(52) U.S. Cl.
CPC .......... *G06F 3/0412* (2013.01); *G02F 1/1368* (2013.01); *G02F 1/13338* (2013.01); *G02F 1/13394* (2013.01); *G02F 1/133345* (2013.01); *G02F 1/133514* (2013.01); *G02F 1/136286* (2013.01); *G06F 3/047* (2013.01); *H01L 27/1214* (2013.01); *G02F 2201/121* (2013.01);
(Continued)

(58) Field of Classification Search
CPC ...................................................... G06F 3/0412
See application file for complete search history.

(56) References Cited

U.S. PATENT DOCUMENTS

| | | | | |
|---|---|---|---|---|
| 2002/0008800 A1* | 1/2002 | Matsumoto | ....... | G02F 1/136209 349/44 |
| 2005/0270472 A1* | 12/2005 | Yamada | ............. | G02F 1/13394 349/156 |
| 2016/0011445 A1* | 1/2016 | Chen | ..................... | G02F 1/1337 349/110 |

* cited by examiner

*Primary Examiner* — Dong Hui Liang
(74) *Attorney, Agent, or Firm* — Leong C. Lei

(57) ABSTRACT

An in-cell touch display panel and an electronic device are provided. The in-cell touch display panel includes a plurality of photo spacers (PSs) configured to stand on a protection layer along a direction in which dummy lines extend. The dummy lines are disconnected in standing locations of the PSs. The PSs are arrange to avoid a metallic wiring layer, and the standing locations of PSs are flatter. As such, supporting height of the PSs are the same, and a cell thickness is made uniform. The dark stripe issue caused by the configuration of the PSs may be avoided, and so does the un-recoverable Push Mura, water ripple, and bright and dark spots. At the same time, the surface pressure and the display performance of the in-cell touch display panel may be enhanced.

15 Claims, 6 Drawing Sheets

(51) Int. Cl.
  *G02F 1/1339* (2006.01)
  *H01L 27/12* (2006.01)
  *G02F 1/1362* (2006.01)
  *G06F 3/044* (2006.01)
(52) U.S. Cl.
  CPC ........ *G02F 2201/123* (2013.01); *G06F 3/044* (2013.01)

IN-CELL TOUCH DISPLAY PANELS AND ELECTRONIC DEVICES

BACKGROUND OF THE INVENTION

1. Field of the Invention

The present disclosure relates to touch display technology, and more particularly to an in-cell touch display panel and an electronic device.

2. Discussion of the Related Art

With the development of touch display technology, In-cell touch display panels have been widely adopted by electronic devices, such as cellular phones. As the in-cell touch display panels integrate the touch and the display function, that is, the touch circuit and the display circuit are formed on the thin film transistor (TFT) array substrate, which is usually referred to as a TFT substrate. Such configuration contributes to a high transmission rate, and the electronic device may be designed to be lighter and thinner.

In-cell touch display panels may include self-capacitance and mutual-capacitance types. Regardless of the above-mentioned types, to integrate the touch and the display function, additional manufacturing processes are configured on the array circuit of the TFT substrate. The additional manufacturing processes include configuring a layer of metallic wiring to be the touch sensing wirings, which are usually configured on a topper layer of the TFT substrate. As the line width of the metallic wirings is thinner, and the film thickness is thicker, the metallic wirings can be easily seen on the TFT substrate. After the TFT substrate and the color filter (CF) are assembled, according to the conventional design of the liquid crystal panels, some of the photoresist spacers (PSs) between the TFT substrate and the CF are above the metallic wirings, and some of the PSs are not above the metallic wirings, which may cause the dark stripe issue on the liquid crystal panel. In addition, the issues such as insufficient surface pressure, un-recoverable Push Mura, and water ripples may occur.

Referring to FIGS. 1, 2, and 3, the in-cell touch display panels includes a TFT substrate 100, a CF substrate 200 opposite to the TFT substrate 100, a liquid crystal layer 300 between the TFT substrate 100 and the CF substrate 200, a plurality of PSs 400 between the TFT substrate 100 and the CF substrate 200. The TFT substrate 100 includes a flat layer 101, a common electrode layer 102, an inter-layer insulation layer 103 covering the common electrode layer 102, a metallic layer 104 above the inter-layer insulation layer 103, a protection layer 105 covering the metallic layer 104, and a pixel electrode layer 106 covering the protection layer 105. Usually, a substrate layer, a gate layer, an active layer, a source/drain layer, and a plurality of insulation layers are arranged below the flat layer.

The common electrode layer 102 includes a plurality of touch electrodes 1021 spaced apart from each other, and the touch electrodes 1021 are arranged in a matrix. The metallic layer 104 includes a plurality of touch sensing lines 1041 and a plurality of dummy lines 1042 corresponding to each of the touch electrodes 1021. The touch sensing lines 1041 pass through the through holes (not shown) on the inter-layer insulation layer 103 to contact the touch electrodes 1021 so as to connect each of the touch electrodes 1021 to a touch driving chip 900. The dummy lines 1042 are disconnected on a gap between two adjacent touch electrodes 1021.

As the film thickness of the metallic layer 104 is large, the pattern directly affect the outline of the TFT substrate 100. With respect to the PS 400 design of conventional in-cell touch display panels, the PSs 400 are arranged in accordance with rules, that is, the pattern of the metallic layer 104 has not been considered. Most of the PSs 400 are arranged above the dummy lines 1042, and a portion of the PSs 400 may be above the gap of the two adjacent touch electrodes 1021, that is, the disconnected portion of the dummy lines 1042. When the TFT substrate 100 and the CF substrate 200 are assembled, some of the PSs 400 may touch the dummy lines 1042 or the disconnected portion of the dummy lines 1042. Also, as the line width of the dummy lines 1042 is about 3 um, and the width of the PS 400 is about 6 um, this may result in unstable PSs 400. As such, the surface pressure of the panel may not be enough, which not only may affect the strength of the product, but also may cause un-recoverable Push Mura, water ripple, and bright and dark spots. In addition, as some of the PSs 400 are not above the dummy lines 1042, the cell thickness may be smaller, compared to the location where the PSs 400 are above the dummy lines 1042. Thus, the transmission rate of the panel may be greater, and so does the brightness, which may cause dark stripe on the gap of two adjacent touch electrodes 1021.

SUMMARY

The present disclosure relates to an in-cell touch display panel to avoid the dark stripe issue caused by the configuration of the PSs so as to avoid the un-recoverable Push Mura, water ripple, and bright and dark spots. At the same time, the surface pressure and the display performance of the in-cell touch display panel may be enhanced.

In one aspect, an in-cell touch display panel includes: a thin film transistor (TFT) substrate, a color filter (CF) substrate opposite to the TFT substrate, a liquid crystal layer between the gate insulation layer and the CF substrate, a plurality of photoresist spacers (PSs) between the TFT substrate and the CF substrate; the TFT substrate includes a flat layer, a common electrode layer above the flat layer, an inter-layer insulation layer covering the common electrode layer, a metallic layer above the inter-layer insulation layer, and a protection layer covering the metallic layer; the common electrode layer includes a plurality of touch electrodes spaced apart from each other, and the touch electrodes being arranged in a matrix, and the metallic layer includes a plurality of effective touch sensing lines and a plurality of dummy lines; the PSs being configured to stand on the protection layer along an extending direction of the dummy lines, and the dummy lines are disconnected in standing locations of the PSs.

Wherein the effective touch sensing lines contact the touch electrodes to connect the touch electrodes with a touch driving chip.

Wherein the effective touch sensing lines contact the touch electrodes via through holes on the inter-layer insulation layer.

Wherein each of the touch electrodes correspond to the effective touch sensing lines and the dummy lines parallel to the effective touch sensing lines, and the effective touch sensing lines and the dummy lines are arranged in an alternated manner.

Wherein each of the touch electrodes corresponds to pixels arranged in a matrix, and one pixel row includes a plurality of sub-pixels, and each of the sub-pixel rows corresponds to one effective touch sensing line and one dummy line.

Wherein the common electrode layer and the pixel electrode layer are made by Indium Tin Oxide (ITO).

Wherein each of the pixels includes a red sub-pixel, a green sub-pixel, a blue sub-pixel arranged in sequence.

Wherein the PSs stand above the corresponding touch electrodes.

In another aspect, an electronic device includes the above in-cell touch display panel.

In another aspect, an in-cell touch display panel includes: a thin film transistor (TFT) substrate, a color filter (CF) substrate opposite to the TFT substrate, a liquid crystal layer between the gate insulation layer and the CF substrate, a plurality of photoresist spacers (PSs) between the TFT substrate and the CF substrate; the TFT substrate includes a flat layer, a common electrode layer above the flat layer, an inter-layer insulation layer covering the common electrode layer, a metallic layer above the inter-layer insulation layer, and a protection layer covering the metallic layer; the common electrode layer includes a plurality of touch electrodes spaced apart from each other, and the touch electrodes being arranged in a matrix, and the metallic layer includes a plurality of effective touch sensing lines and a plurality of dummy lines; the PSs being configured to stand on the protection layer along an extending direction of the dummy lines, and the dummy lines are disconnected in standing locations of the PSs; wherein the effective touch sensing lines contact the touch electrodes to connect the touch electrodes with a touch driving chip; wherein the PSs stand above the corresponding touch electrodes.

In view of the above, the in-cell touch display panel and the electronic device includes a plurality of PSs standing on the protection layer along an extending direction of the dummy lines of the metallic wiring layer. In addition, the dummy lines are disconnected in the standing location of the PSs such that the PSs avoid the metallic wiring layer, and the location where the PSs stand is flatter. As such, the supporting height of the PSs are the same, and the cell thickness is uniform. The dark stripe issue caused by the configuration of the PSs may be avoided, and so does the un-recoverable Push Mura, water ripple, and bright and dark spots. At the same time, the surface pressure and the display performance of the in-cell touch display panel may be enhanced, and no additional mask process and manufacturing process are needed.

BRIEF DESCRIPTION OF THE DRAWINGS

Many aspects of the present embodiments can be better understood with reference to the following drawings. In conjunction with the accompanying drawings, the technical solutions and advantages of the present disclosure will be illustrated by the detailed descriptions of the embodiments.

DETAILED DESCRIPTION OF THE EMBODIMENTS

Embodiments of the invention will now be described more fully hereinafter with reference to the accompanying drawings, in which embodiments of the invention are shown.

Referring to FIGS. 4-7, the in-cell touch display panel includes a TFT substrate 1, a CF substrate 2 opposite to the TFT substrate 1, a liquid crystal layer 3 between the gate insulation layer 1 and the CF substrate 2, a plurality of PSs 4 between the TFT substrate 1 and the CF substrate 2.

Figure 1:
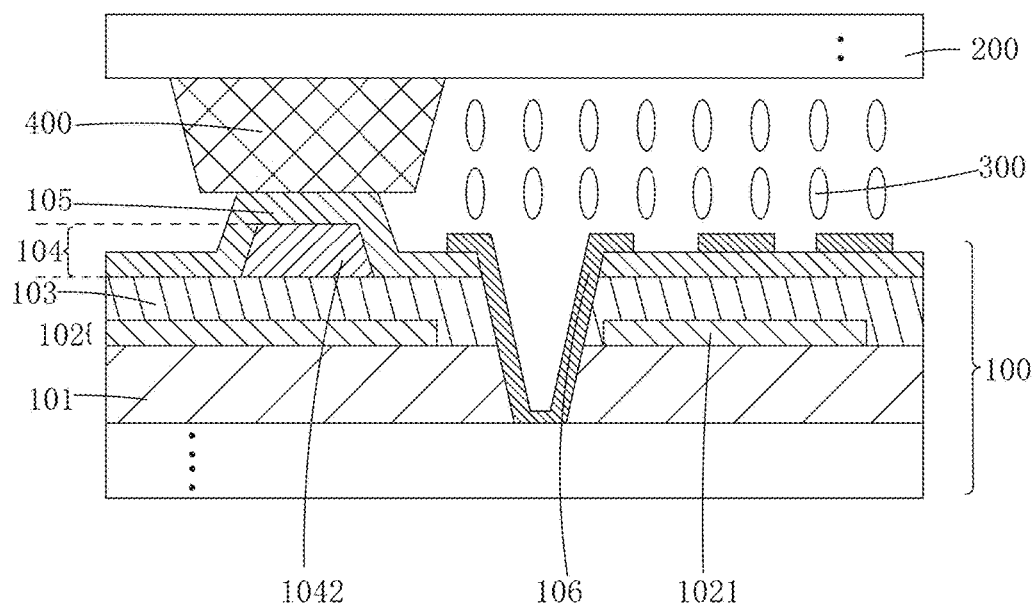
FIG. 1 is a cross section view of the PSs of one conventional in-cell touch display panel.
Figure 2:
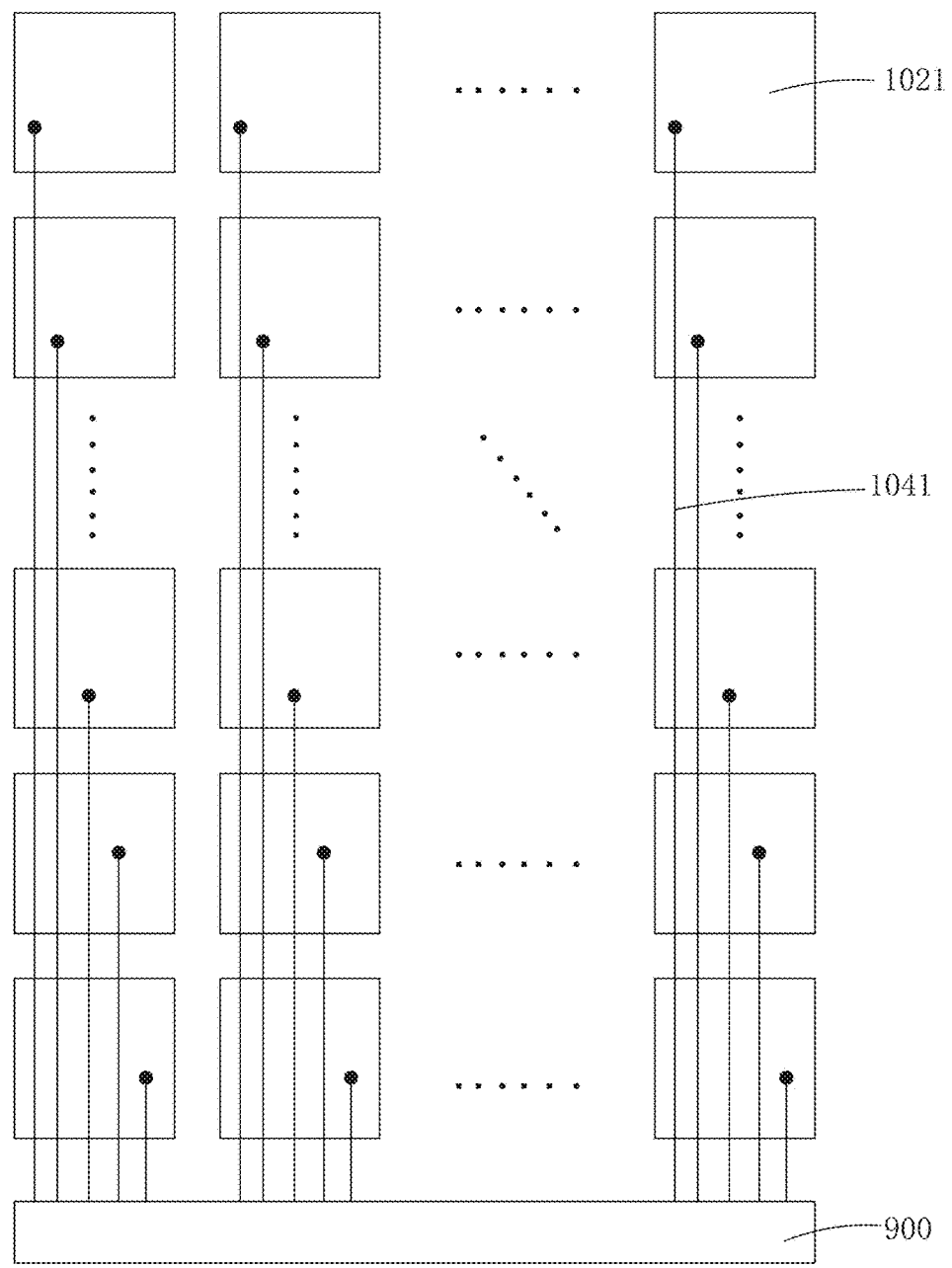
FIG. 2 is a schematic view showing the touch electrode and the touch sensing lines of the metallic wiring layer of one conventional in-cell touch display panel.
Figure 3:
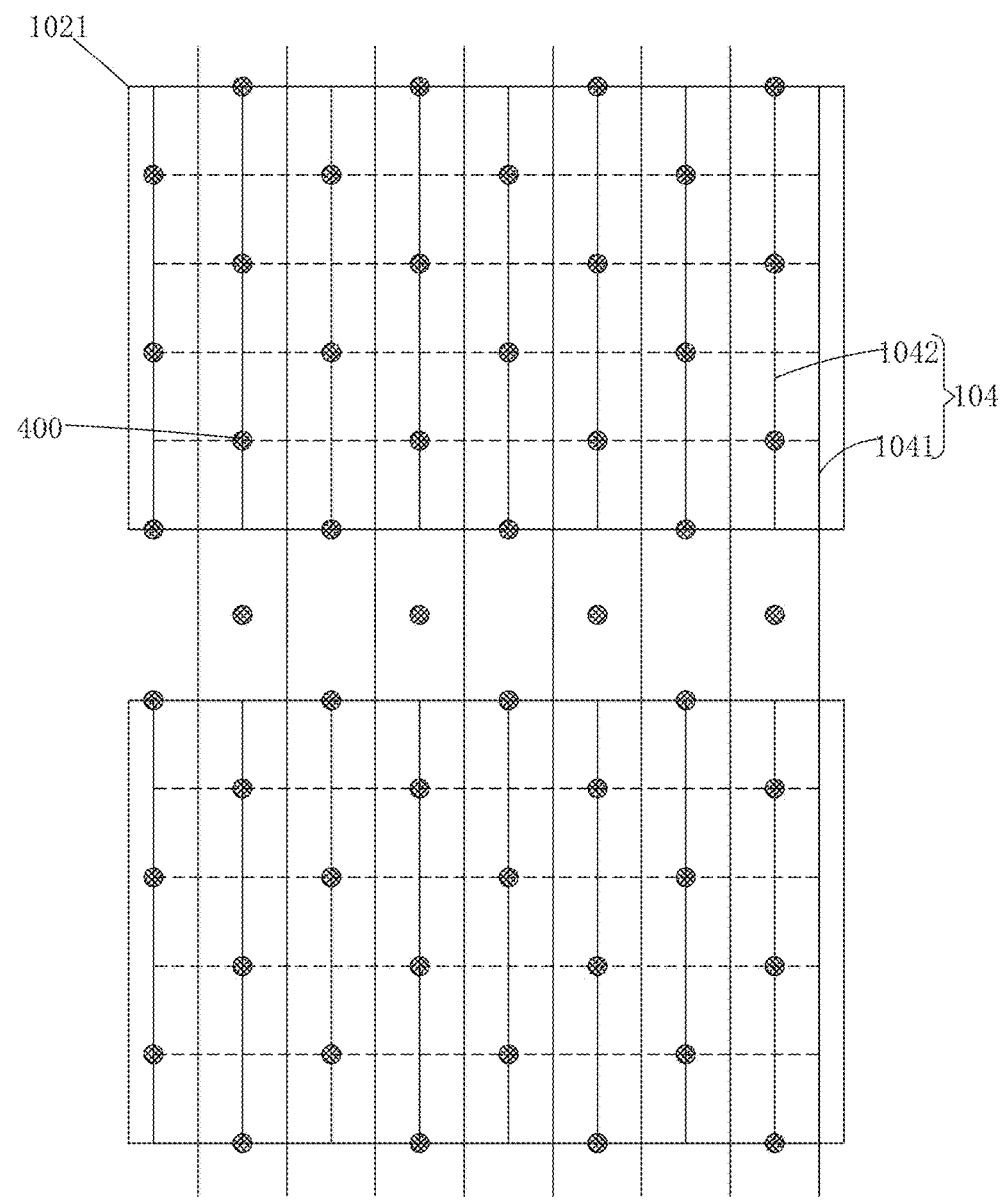
FIG. 3 is a schematic view showing the metallic wiring layer and the PS corresponding to two adjacent touch electrodes of one conventional in-cell touch display panel.
Figure 4:
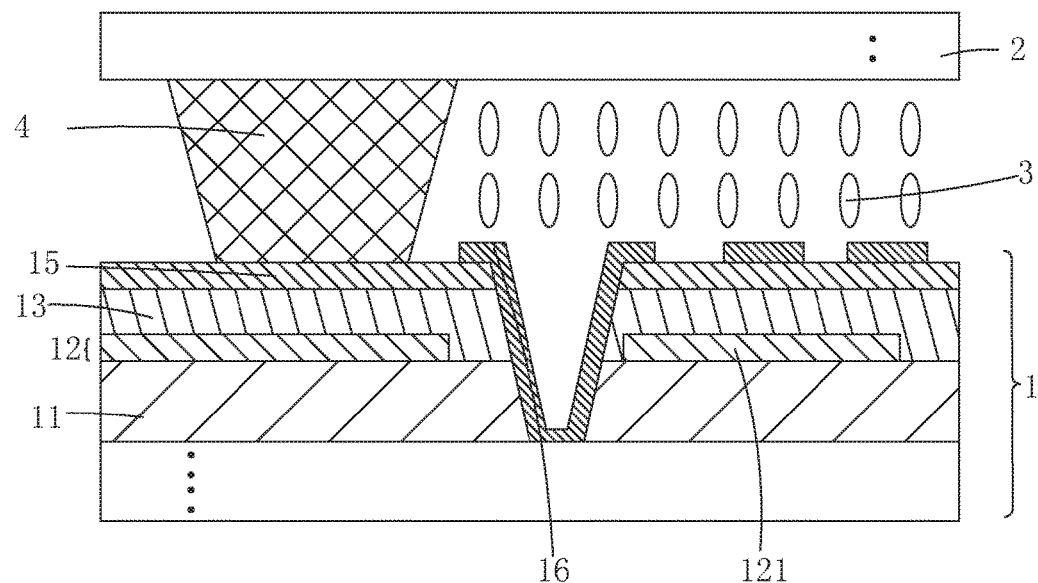
FIG. 4 is a cross sectional view of the PSs on the in-cell touch display panel in accordance with one embodiment.
Figure 5:
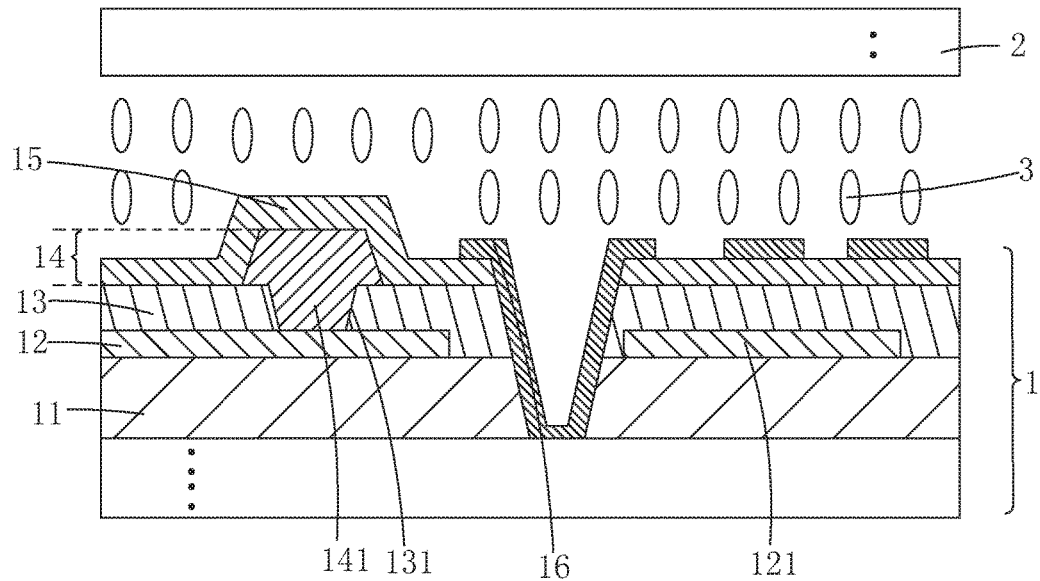
FIG. 5 is a cross sectional view showing the location where the effective touch sensing lines contacts with the touch electrodes of the in-cell touch display panel in accordance with one embodiment.

As shown in FIGS. 4 and 5, the TFT substrate 1 includes a flat layer 11, a common electrode layer 12 above the flat layer 11, an inter-layer insulation layer 13 covering the common electrode layer 12, a metallic wiring layer 14 above the inter-layer insulation layer 13, a protection layer 15 covering the metallic wiring layer 14, and a pixel electrode layer 16 above the protection layer 15. Referring to FIGS. 4-7, the common electrode layer 12 includes a plurality of touch electrodes 121 spaced apart from each other, and the touch electrodes 121 are arranged in a matrix. The metallic wiring layer 14 includes a plurality of effective touch sensing lines 141 and a plurality of dummy lines 142.

Figure 6:
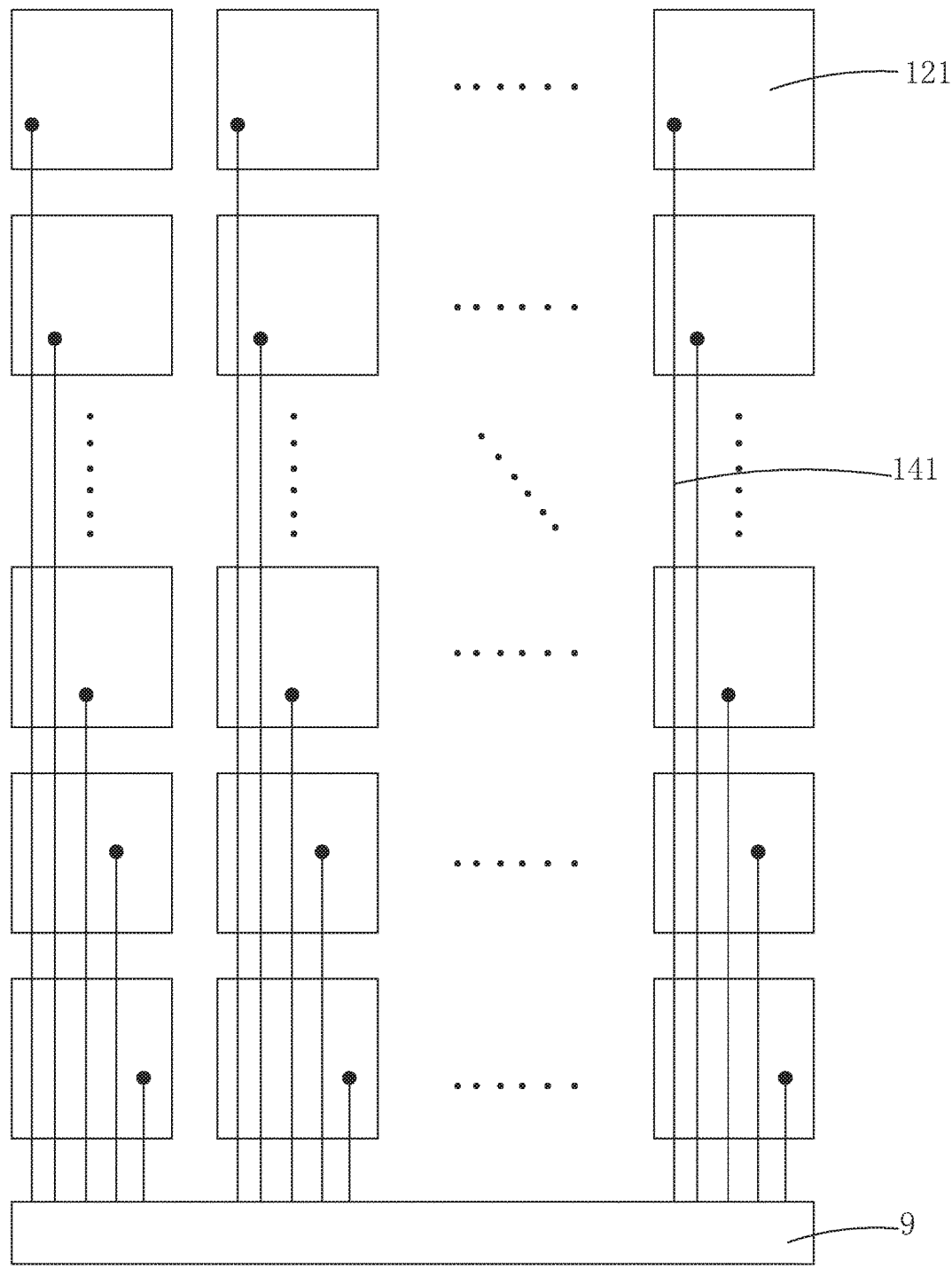
FIG. 6 is a schematic view showing the touch electrode and the touch sensing lines of the metallic wiring layer of the in-cell touch display panel in accordance with one embodiment.

Referring to FIGS. 5 and 6, the effective touch sensing lines 141 pass through a through hole 131 to contact with the touch electrodes 121 so as to connect the touch electrodes 121 with a touch driving chip 9. Prior to and after the in-cell touch display panel is touched by a finger, the capacitance-charge amounts sensed by the touch electrodes 121 are different. The location touched by the finger may be determined by detecting a changed amount of the capacitance prior to and after the in-cell touch display panel is touched.

It is to be noted that, referring to FIGS. 4-7, the PSs 4 are configured to stand on the protection layer 15 along an extending direction of the dummy lines 142. The dummy lines 142 are disconnected by the corresponding PS 4. Compared to the conventional solution, the proposed configuration of the metallic wiring layer 14 and the PSs 4 is enhanced. The PS 4 is not configured to stand on the metallic wiring layer 14 such that the location where the PSs 4 stand is flatter. As the height of the PSs 4 are the same, the cell thickness of the liquid crystal layer is uniform. The dark stripe issue caused by the configuration of the PSs may be avoided, and so does the un-recoverable Push Mura, water ripple, and bright and dark spots. At the same time, the surface pressure and the display performance of the in-cell touch display panel may be enhanced, and no additional mask process and manufacturing process are needed.

Specifically, the TFT substrate 1 further includes a substrate layer, a gate layer, an active layer, a source/drain layer, and a plurality of insulation layers are arranged below the flat layer 11. The common electrode layer 12 and the pixel electrode layer 16 are made by Indium Tin Oxide (ITO).

The CF substrate 2 includes a substrate layer and a CF layer, and the CF layer includes red, green, and blue photo-resistors, and at least one black matrix.

Figure 7:
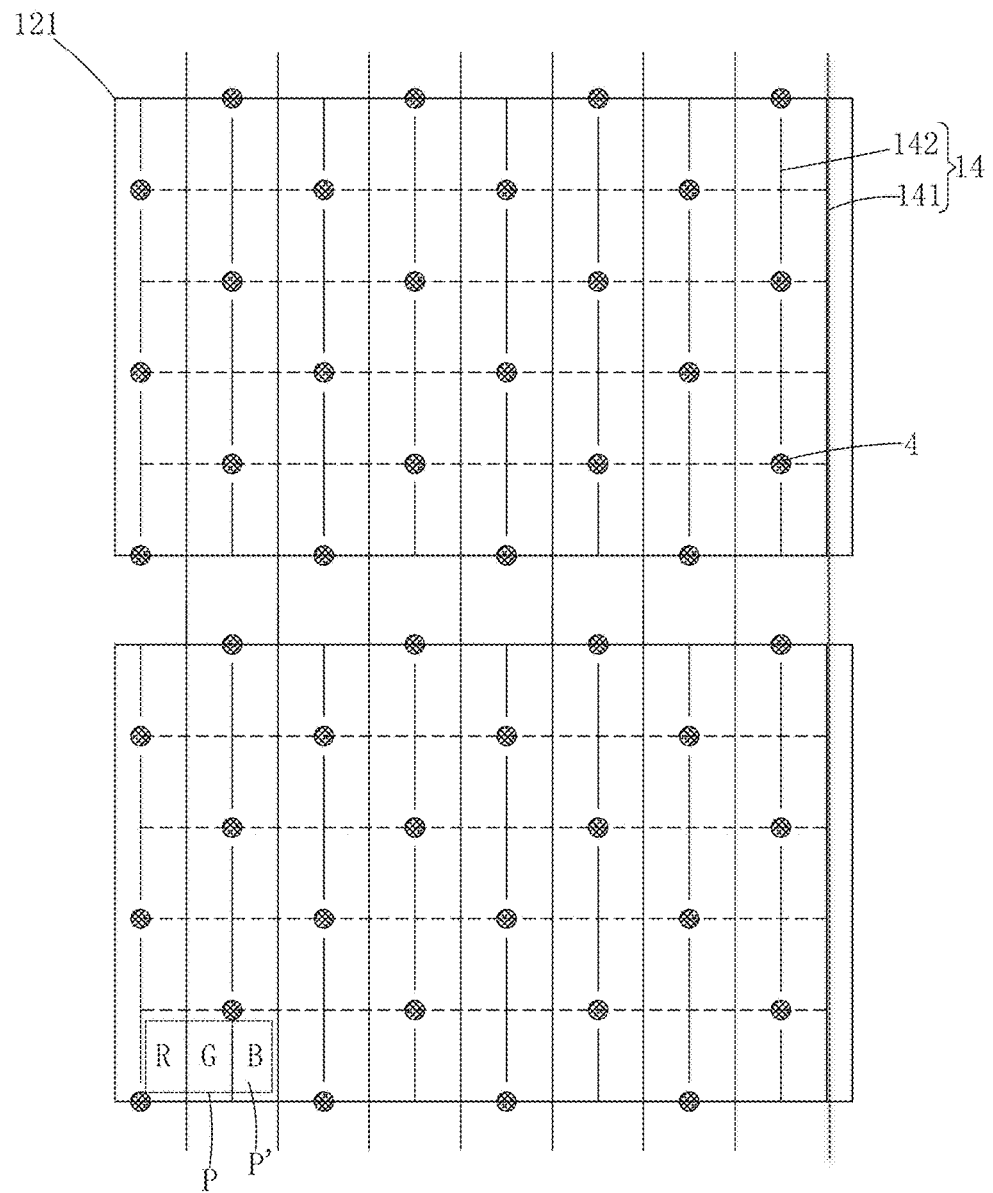
FIG. 7 is a schematic view showing the metallic wiring layer and the PS corresponding to two adjacent touch electrodes of the in-cell touch display panel in accordance with one embodiment.

Referring to FIGS. 6 and 7, each of the touch electrodes 121 corresponds to a plurality of effective touch sensing lines 141 and a plurality of dummy lines 142 parallel to the effective touch sensing lines 141, and the effective touch sensing lines 141 and the dummy lines 142 are arranged in an alternated manner.

Further, each of the touch electrodes 121 corresponds to pixels (P) arranged in a matrix. One pixel row (P) includes a plurality of sub-pixels (P'), and each of the sub-pixel rows corresponds to one effective touch sensing line 141 and one dummy line 142. Specifically, each of the pixels (P) includes a red sub-pixel (R), a green sub-pixel (G), a blue sub-pixel (B), and a plurality of sub-pixels (P').

Further, as the gap between the touch electrodes 121 may affect the outline of the TFT substrate 1, the PSs 4 are configured to be above the touch electrodes 121, that is, the PSs 4 are not arranged in the gap between two adjacent touch electrodes 121 so as to ensure that supporting heights of the PSs 4 are the same, that is, the cell thickness is the same.

The present disclosure also includes an electronic device having the above in-cell touch display panel, and the electronic device may include, but not limited to, LCD-TVs, smart phones, digital cameras, tablets, and smart watches incorporating with the touch functions.

In view of the above, the in-cell touch display panel and the electronic device includes a plurality of PSs standing on the protection layer along an extending direction of the dummy lines of the metallic wiring layer. In addition, the dummy lines are disconnected in the standing location of the PSs such that the PSs avoid the metallic wiring layer, and the location where the PSs stand is flatter. As such, the supporting height of the PSs are the same, and the cell thickness is uniform. The dark stripe issue caused by the configuration of the PSs may be avoided, and so does the un-recoverable Push Mura, water ripple, and bright and dark spots. At the same time, the surface pressure and the display performance of the in-cell touch display panel may be enhanced, and no additional mask process and manufacturing process are needed.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An in-cell touch display panel, comprising:
   a thin film transistor (TFT) substrate, a color filter (CF) substrate opposite to the TFT substrate, a liquid crystal layer between a gate insulation layer and the CF substrate, a plurality of photoresist spacers (PSs) between the TFT substrate and the CF substrate;
   the TFT substrate comprising a flat layer, a common electrode layer above the flat layer, an inter-layer insulation layer covering the common electrode layer, a metallic layer above the inter-layer insulation layer, and a protection layer covering the metallic layer; the common electrode layer comprising a plurality of touch electrodes spaced apart from each other, and the touch electrodes being arranged in a matrix, and the metallic layer comprising a plurality of effective touch sensing lines and a plurality of dummy lines;
   the PSs being configured to stand on the protection layer along an extending direction of the dummy lines, and the dummy lines being disconnected in standing locations of the PSs.

2. The in-cell touch display panel as claimed in claim 1, wherein the effective touch sensing lines contact the touch electrodes to connect the touch electrodes with a touch driving chip.

3. The in-cell touch display panel as claimed in claim 2, wherein each of the touch electrodes corresponds to the effective touch sensing lines and the dummy lines parallel to the effective touch sensing lines, and the effective touch sensing lines and the dummy lines are arranged in an alternated manner.

4. The in-cell touch display panel as claimed in claim 3, wherein each of the touch electrodes corresponds to pixels arranged in a matrix, and one pixel row comprises a plurality of sub-pixels, and each of the sub-pixel rows corresponds to one effective touch sensing line and one dummy line.

5. The in-cell touch display panel as claimed in claim 4, wherein each of the pixels comprises a red sub-pixel, a green sub-pixel, a blue sub-pixel arranged in sequence.

6. The in-cell touch display panel as claimed in claim 2, wherein the effective touch sensing lines contact the touch electrodes via through holes on the inter-layer insulation layer.

7. The in-cell touch display panel as claimed in claim 1, wherein the common electrode layer is made of Indium Tin Oxide (ITO).

8. The in-cell touch display panel as claimed in claim 1, wherein the PSs stand above the corresponding touch electrodes.

9. An electronic device comprising the in-cell touch display panel as claimed in claim 1.

10. An in-cell touch display panel, comprising:
    a thin film transistor (TFT) substrate, a color filter (CF) substrate opposite to the TFT substrate, a liquid crystal layer between a gate insulation layer and the CF substrate, a plurality of photoresist spacers (PSs) between the TFT substrate and the CF substrate;
    the TFT substrate comprising a flat layer, a common electrode layer above the flat layer, an inter-layer insulation layer covering the common electrode layer, a metallic layer above the inter-layer insulation layer, and a protection layer covering the metallic layer; the common electrode layer comprising a plurality of touch electrodes spaced apart from each other, and the touch electrodes being arranged in a matrix, and the metallic layer comprising a plurality of effective touch sensing lines and a plurality of dummy lines;
    the PSs being configured to stand on the protection layer along an extending direction of the dummy lines, and the dummy lines being disconnected in standing locations of the PSs;
    wherein the effective touch sensing lines contact the touch electrodes to connect the touch electrodes with a touch driving chip;
    wherein the PSs stand above the corresponding touch electrodes.

11. The in-cell touch display panel as claimed in claim 10, wherein each of the touch electrodes corresponds to the effective touch sensing lines and the dummy lines parallel to the effective touch sensing lines, and the effective touch sensing lines and the dummy lines are arranged in an alternated manner.

12. The in-cell touch display panel as claimed in claim 11, wherein each of the touch electrodes corresponds to pixels arranged in a matrix, and one pixel row comprises a plurality of sub-pixels, and each of the sub-pixel rows corresponds to one effective touch sensing line and one dummy line.

13. The in-cell touch display panel as claimed in claim 12, wherein each of the pixels comprises a red sub-pixel, a green sub-pixel, a blue sub-pixel arranged in sequence.

14. The in-cell touch display panel as claimed in claim 10, wherein the effective touch sensing lines contact the touch electrodes via through holes on the inter-layer insulation layer.

15. The in-cell touch display panel as claimed in claim 10, wherein the common electrode layer is made of Indium Tin Oxide (ITO).

\* \* \* \* \*